United States Patent
Ito et al.

(10) Patent No.: US 8,086,889 B2
(45) Date of Patent: Dec. 27, 2011

(54) SEMICONDUCTOR INTEGRATED CIRCUIT DEVICE FOR SCAN TESTING

(75) Inventors: Yuichi Ito, Ome (JP); Yasuhiro Fujimura, Hamura (JP); Koki Tsutsumida, Ome (JP); Shigeru Nakahara, Higashiyamato (JP)

(73) Assignee: Hitachi, Ltd., Tokyo (JP)

( * ) Notice: Subject to any disclaimer, the term of this patent is extended or adjusted under 35 U.S.C. 154(b) by 525 days.

(21) Appl. No.: 12/256,535

(22) Filed: Oct. 23, 2008

(65) Prior Publication Data
US 2009/0113230 A1 Apr. 30, 2009

(30) Foreign Application Priority Data
Oct. 26, 2007 (JP) ................................. 2007-278308

(51) Int. Cl.
*G06F 1/04* (2006.01)
*G01R 31/28* (2006.01)

(52) U.S. Cl. ................. 713/500; 714/726; 714/729

(58) Field of Classification Search .................. 714/726, 714/729; 713/500
See application file for complete search history.

(56) References Cited

U.S. PATENT DOCUMENTS

| | | | |
|---|---|---|---|
| 6,591,388 B1 * | 7/2003 | Vonreyn | 714/726 |
| 7,188,326 B2 | 3/2007 | Yoshida | |
| 7,330,994 B2 * | 2/2008 | Frederick | 713/600 |
| 7,447,961 B2 * | 11/2008 | Tan | 714/726 |
| 7,698,611 B2 * | 4/2010 | Grise et al. | 714/726 |
| 2006/0107145 A1 * | 5/2006 | Athavale et al. | 714/727 |
| 2007/0061657 A1 * | 3/2007 | Chang et al. | 714/742 |
| 2008/0222471 A1 * | 9/2008 | Sul et al. | 714/731 |

FOREIGN PATENT DOCUMENTS
JP 2003-240822 A 8/2003
JP 2005-024359 A 1/2005

* cited by examiner

*Primary Examiner* — Glenn A Auve
(74) *Attorney, Agent, or Firm* — Miles & Stockbridge P.C.

(57) ABSTRACT

A scan chain group structure in which a group of scan chains formed for each clock tree system in an LSI is subjected to a reconnection process so that the scan chain group is not present across a plurality of clock distribution regions obtained by dividing the clock-supplied region of the clock tree of one system and that the connection distance thereof in the distribution region becomes short, a test clock input mechanism in which test clocks to be input to the distribution regions are independent sub-clock phases, and an on/off mechanism of the clocks to be input to the distribution regions are realized. Further, the scan-in/out and scan test performed at the same time are limited in one region or between single regions, and tests in all regions and between all regions are carried out by a plurality of times of test steps.

4 Claims, 10 Drawing Sheets

US 8,086,889 B2

SEMICONDUCTOR INTEGRATED CIRCUIT DEVICE FOR SCAN TESTING

CROSS-REFERENCE TO RELATED APPLICATION

The present application claims priority from Japanese Patent Application No. JP 2007-278308 filed on Oct. 26, 2007, the content of which is hereby incorporated by reference into this application.

TECHNICAL FIELD OF THE INVENTION

The present invention relates to a semiconductor integrated circuit device. More particularly, it relates to the reduction of noise caused by power supply voltage drop in a test of a semiconductor integrated circuit device.

BACKGROUND OF THE INVENTION

Conventional techniques related to a test of a semiconductor integrated circuit include the technique described in Japanese Patent Application Laid-Open Publication No. 2003-240822 (Patent Document 1). In the method of Patent Document 1, the duties of the clocks input to scan chains which are respectively formed for clock systems are changed so that the number of flip-flops operated at the same time is reduced, thereby reducing power-supply noise. In the conventional technique described in Patent Document 1, the flip-flops in one clock system are configured to operate at the same time. Therefore, when one clock system is dominant and the majority of flip-flops are driven, power-supply noise cannot be sufficiently reduced.

There is also another conventional technique described in Japanese Patent Application Laid-Open Publication No. 2005-024359 (Patent Document 2). In the method of Patent Document 2, one clock signal source is divided into a plurality of clock signals, and the clock signals of releasing or capturing are shifted with respect to groups of flip-flops which are grouped respectively for supplied clock signals, thereby reducing the power-supply noise. In the conventional technique described in Patent Document 2, the clock system is divided, but since the flip-flops of an entire chip are driven in the releasing or capturing of a scan test, the power-supply noise is not sufficiently reduced.

SUMMARY OF THE INVENTION

FIG. 2 is a drawing showing a state of an input clock and a test clock of one certain system in an LSI. A phase lock loop (PLL) generates a normal clock. A clock controller (CC) controls switching of the clock input to a test circuit or on/off of the input. A test clock generator (TGN) generates a test clock that is input in scan-in/out or a static test.

In a normal configuration, one test clock is allocated to one clock system, and switching between a normal clock and a test clock is carried out at the point of the origin of a clock tree. Although it is omitted in the drawing, further diverged clock trees are present over the point of 2a of the clock tree, and clocks are input to flip-flops from ends of the clock tree. Note that the clock that passes through 2a is supplied to all the flip-flops present in the region of 2A through the clock tree of next and following phases.

FIG. 9 is a drawing showing a layout state of scan chains to which clocks distributed from the clock tree shown in FIG. 2 are input. 911 to 916 denote the scan chains. Outline squares on the scan chains denote scan flip-flops. Test pattern generators (TPG) write values to the scan flip-flops provided on the scan chains in the scan-in. Multiple input signature registers (MISR) retrieve the values from the scan flip-flops in the scan-out.

In a test employing a scan test, when an entire chip is driven by one test clock distributed from the origin of the clock tree, since random numbers are input from the scan chains to all the scan flip-flops driven by the test clock, the activation rate of the entire chip is instantaneously increased significantly higher than that of a normal usage state. As a result, there is a possibility that unexpected voltage drop of the power supply and power supply noise occur, the scan flip-flops malfunction, and correct test results cannot be obtained. Further, the clock in the scan test can be subjected to time sharing for each region in order to reduce the power supply noise. In this case, however, scan chains which are present across the time-shared clock regions are generated. When the clock is to be subjected to time sharing by the regions shown by dotted lines of FIG. 9, many bidirectional forwardings occur between the divided clocks like 9a to 9b and 9b to 9c. In order to ensure these operations, measures for hold (Hold) of the forwarding between the divided clocks are needed separately. However, it is practically impossible to provide hold measure values of several ns bidirectionally.

Moreover, since the chain configuration of the scan chains as shown in FIG. 9 is normally determined before physical layout of the scan flip-flops, no consideration is made on the wire length and layout location. Therefore, paths having large data forwarding delays are generated, which serve as the factors to inhibit the improvement in execution speed of the scan test.

The typical ones of the inventions disclosed in this application will be briefly described as follows. More specifically, in the scan chain structure formed in the present invention, a group of scan chains formed for each clock system of one or a plurality of clock trees generated in an LSI is subjected to a reconnection process based on physical layout information of shift registers connected to the scan chain group so that the scan chain group does not present across the clock distribution regions of a plurality of sub clock trees obtained by dividing the one clock tree and the connection distance of the scan chain becomes shortest in each clock distribution region. A mechanism of selectively switching a normal clock from a PLL and a test clock for testing is provided for the input of the sub clock trees. Also, a mechanism of inputting independent test clocks with using each test clock to be input to each sub clock tree as a sub clock phase and a control mechanism of turning on/off the input of the clocks to each of the distribution regions are provided, and the power supply noise is reduced by independently testing each of the distribution regions.

The voltage drop of the power supply and the power supply noise in the execution of a scan test are prevented, thereby preventing the malfunction of flip-flops and enabling a highly precise scan test.

BRIEF DESCRIPTIONS OF THE DRAWINGS

DESCRIPTIONS OF THE PREFERRED EMBODIMENTS

Figure 1:
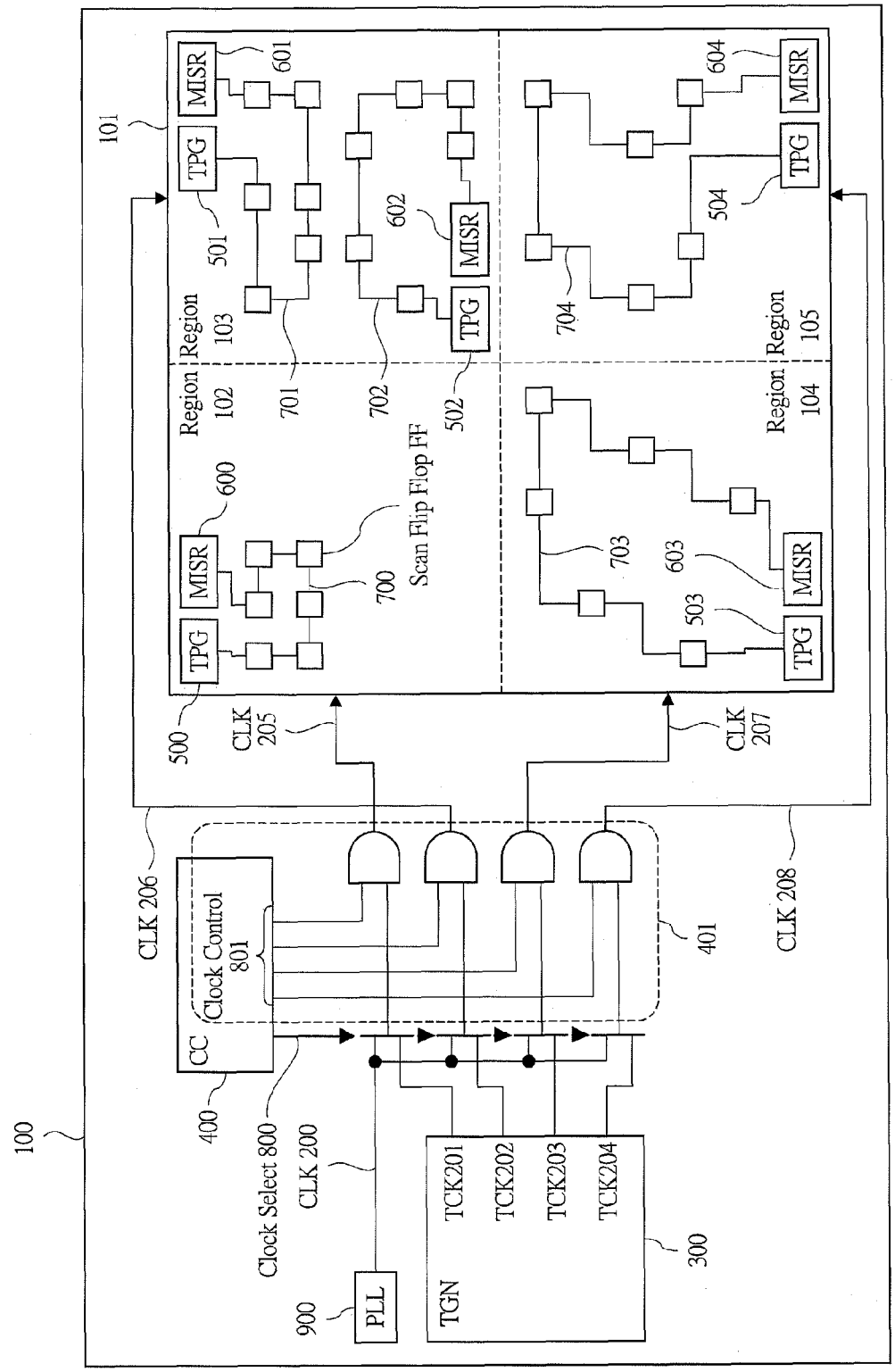
FIG. 1 is a schematic diagram of an entire configuration of the present invention.

Hereinafter, a circuit configuration will be described with reference to FIGS. 1, 3 and 4, a test method will be described with reference to FIGS. 5 to 7, and a circuit designing method will be described with reference to FIGS. 8 and 10.

First, the circuit configuration will be described with reference to FIGS. 1, 3 and 4. FIG. 1 is a drawing showing the idea of the entire configuration of a scan noise prevention post-layout reorder method according to an embodiment of the present invention. In FIG. 1, 100 denotes the entirety of a semiconductor integrated circuit device, 101 denotes a circuit part to be inspected which is a scan target, 200 denotes a normal clock CLK, 300 denotes a test clock generator TGN which generates test clocks to be input in scan-in/out or a static test, 400 denotes a clock controller CC which controls switching of the clocks input to a test circuit and on/off of the input, 500 to 504 denote test pattern generators TPG which generate test patterns and input test data to scan flip-flops in scan-in, 600 to 604 denote multiple input signature registers MISR which retrieve results from the scan flip-flops in scan-out, 700 to 704 denote scan chains, outline squares on the scan chains represent the scan flip-flops, 800 denotes a clock select signal which carries out switching between a normal clock and test clocks, 801 denotes on/off control signals of the clocks input to clock distribution regions, and 900 denotes a phase lock loop PLL which generates a clock.

201 to 204 denote the test clocks generated by the test clock generator 300, and the test clocks become input clocks of 205 to 208, which are input to the circuit to be inspected, through switching from the normal clock in accordance with the clock select signal 800 generated by the clock controller 400 and through the control of an on/off control mechanism 401 of the input clocks controlled by the clock on/off control signals 801. 102 to 105 denote circuit regions to be inspected in which the input clocks 205 to 208 are supplied to the scan flip-flops in the regions, respectively. When the clock tree of input clocks has an H-tree configuration, the divided distribution regions of clocks are not overlapped with each other and can be simply divided. Note that, although the clocks and divided regions are divided into four regions 102 to 105 in FIG. 1, this is merely for the easy understanding of the idea, and the number of division is not limited thereto. Moreover, although only one type of clock system is shown in FIG. 1, in practice, the present invention is applied to at least one clock system of one or a plurality of clock systems present in an LSI, and the range of application is not limited thereto.

Figure 2:
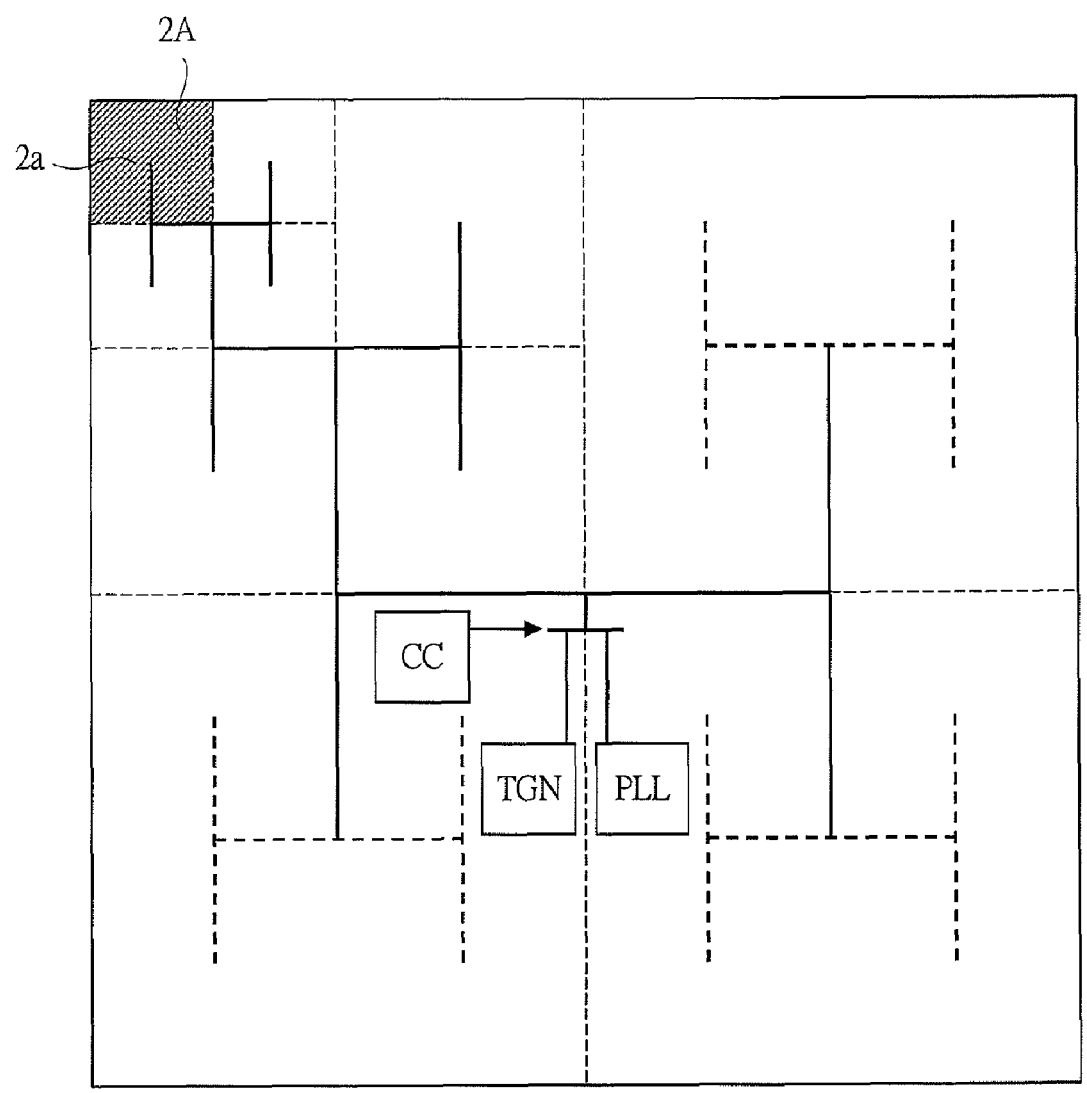
FIG. 2 is a drawing showing a general configuration of a normal clock and a test clock.
Figure 3:
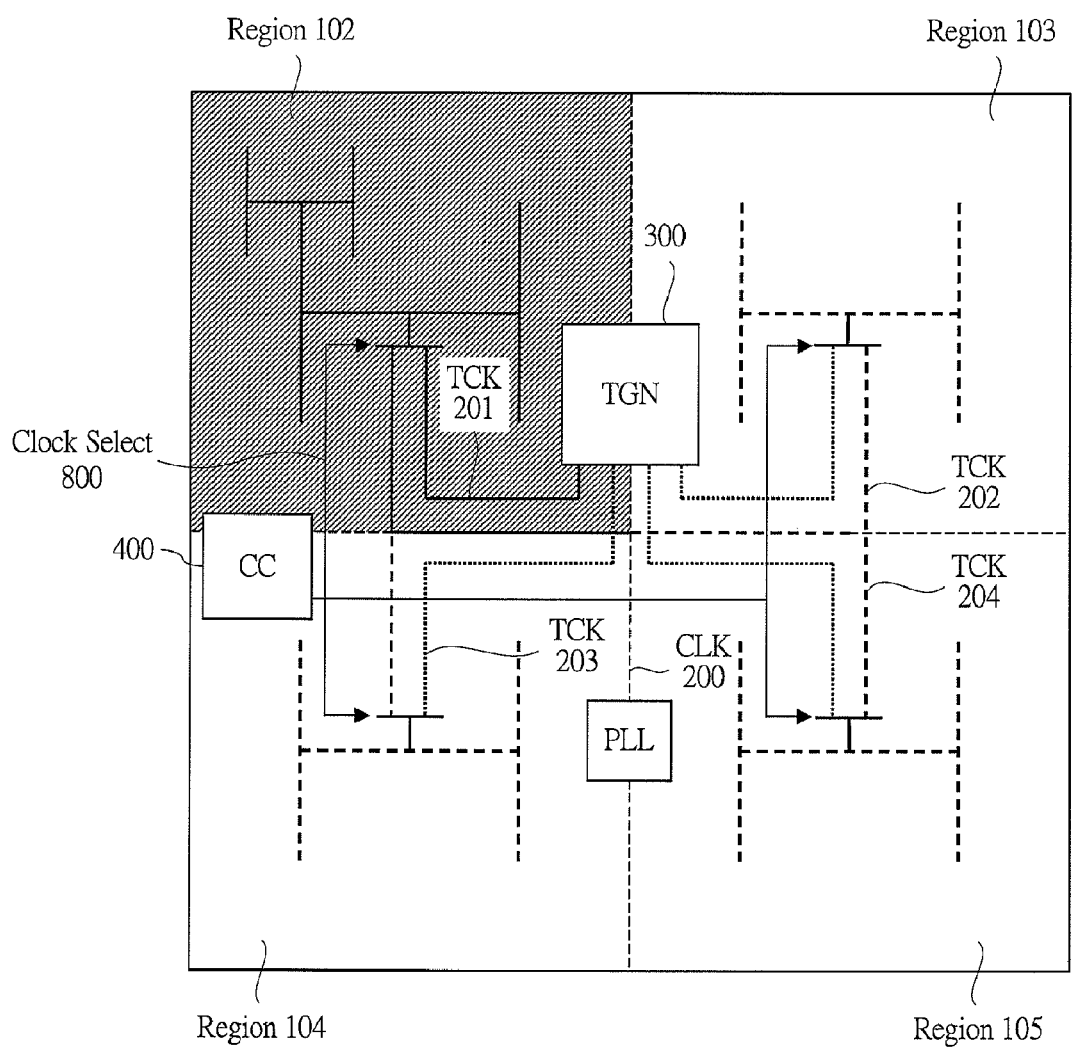
FIG. 3 is a drawing showing a connection method of a normal clock and test clocks in a specific example according to an embodiment of the present invention.

FIG. 3 shows the case where the present invention is applied to a clock system having an H-tree configuration as shown in FIG. 2. In FIG. 3, 900 denotes a PLL which generates a normal clock, and CLK 200 denotes a normal clock generated by the PLL 900. 300 denotes a test clock generator TGN which generates test clocks, 400 denotes a clock controller CC which controls switching of the clocks input to a test circuit and on/off of the inputs, and TCK 201 to 204 denote independent test clocks generated by the test clock generator 300. In accordance with the clock control signal 800 generated by the clock controller 400, the clock to be input to the circuit region to be inspected is selected from among the normal clock and the test clocks. In the present invention, the plurality of independent test clocks TCK 201 to 204 are allocated to the one clock system CLK 200. A clock selection mechanism in accordance with the clock control signal 800 is not inserted at the origin of the normal clock like FIG. 2 but is inserted at the part of the source of the input clocks distributed to the divided circuit regions to be inspected 102 to 105 like FIG. 3. With respect to the normal clock CLK 200 of one system, the independent test clocks TCK 201 to 204 are allocated to the regions 102 to 105, respectively, whereby the scan flip-flops in the regions 102 to 105 can be independently operated in each of the regions in scan-in/out or a static test operated by the test clocks.

Figure 4:
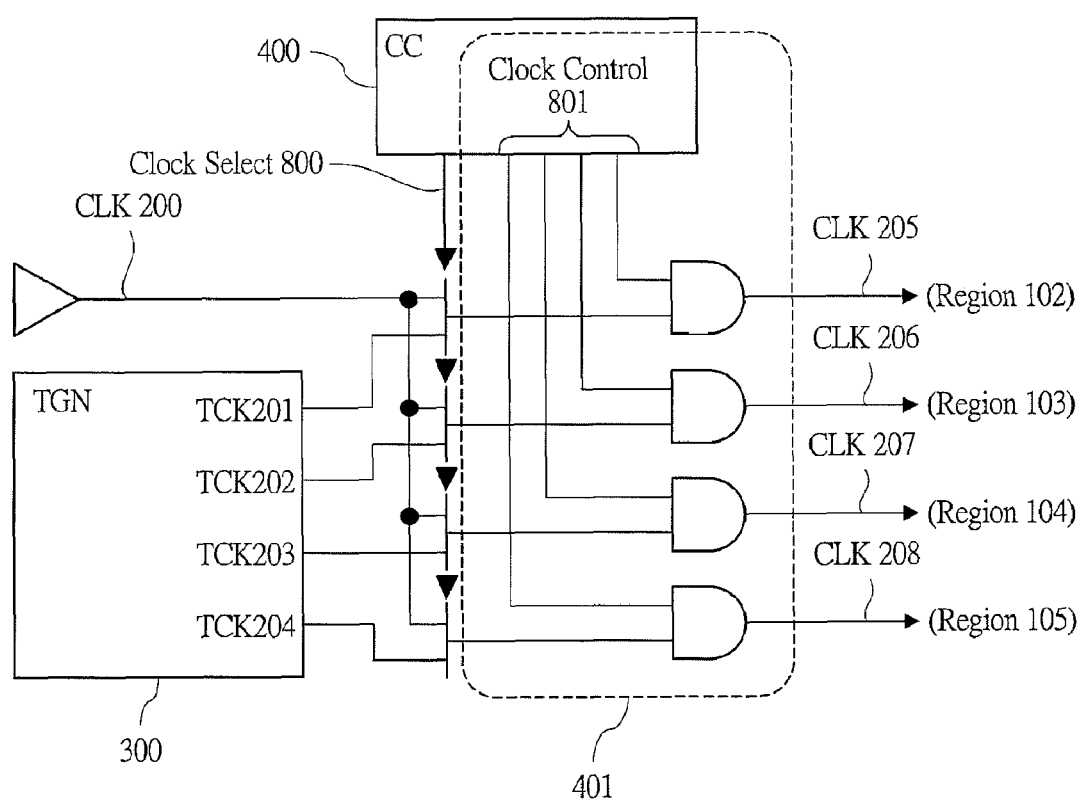
FIG. 4 is a drawing showing a connection method of a mechanism which turns on/off a clock selected from the normal clock and test clocks with respect to each of distribution regions in a specific example according to the embodiment of the present invention.

FIG. 4 is a drawing showing a connection method of the mechanism which turns on/off a clock selected from among the normal clock and test clocks with respect to the circuit regions to be inspected. 300 denotes the test clock generator TGN, 400 denotes the clock controller, CLK 200 denotes the normal clock input from the PLL, TCK 201 to 204 denote the test clocks generated by the test clock generator 300, 800 denotes the clock select signal which is generated by the clock controller 400 and carries out selection of the normal clock and the test clocks, 801 denotes the clock on/off control signals which control on/off to the distribution regions, and 401 denotes the input clock on/off mechanism controlled by the clock on/off control signals. The clock signals CLK 205 to 208 controlled by the input clock on/off mechanism 401 are distributed to the regions 102 to 105, respectively. Although it is omitted in FIG. 3, with respect to the input clock selected by the clock select signal 800, the clock input to the regions 102 to 105 is controlled by the clock on/off mechanism 401 of FIG. 4. The clock select signal 800 selects the clock to be distributed to the regions 102 to 105 from the normal clock and the test clocks. The clock on/off control signals independently control the signals for the regions 102 to 105 so as to control on and off of clock inputs for each of the regions. Since the clock inputs are controlled for each of the regions, it is possible to carry out the test with supplying the clocks only to target regions in a test using the normal clock. By virtue of this configuration, independent clocks can be input to the regions divided in a circuit of an LSI, and test operations for each of the regions can be carried out.

Figure 5:
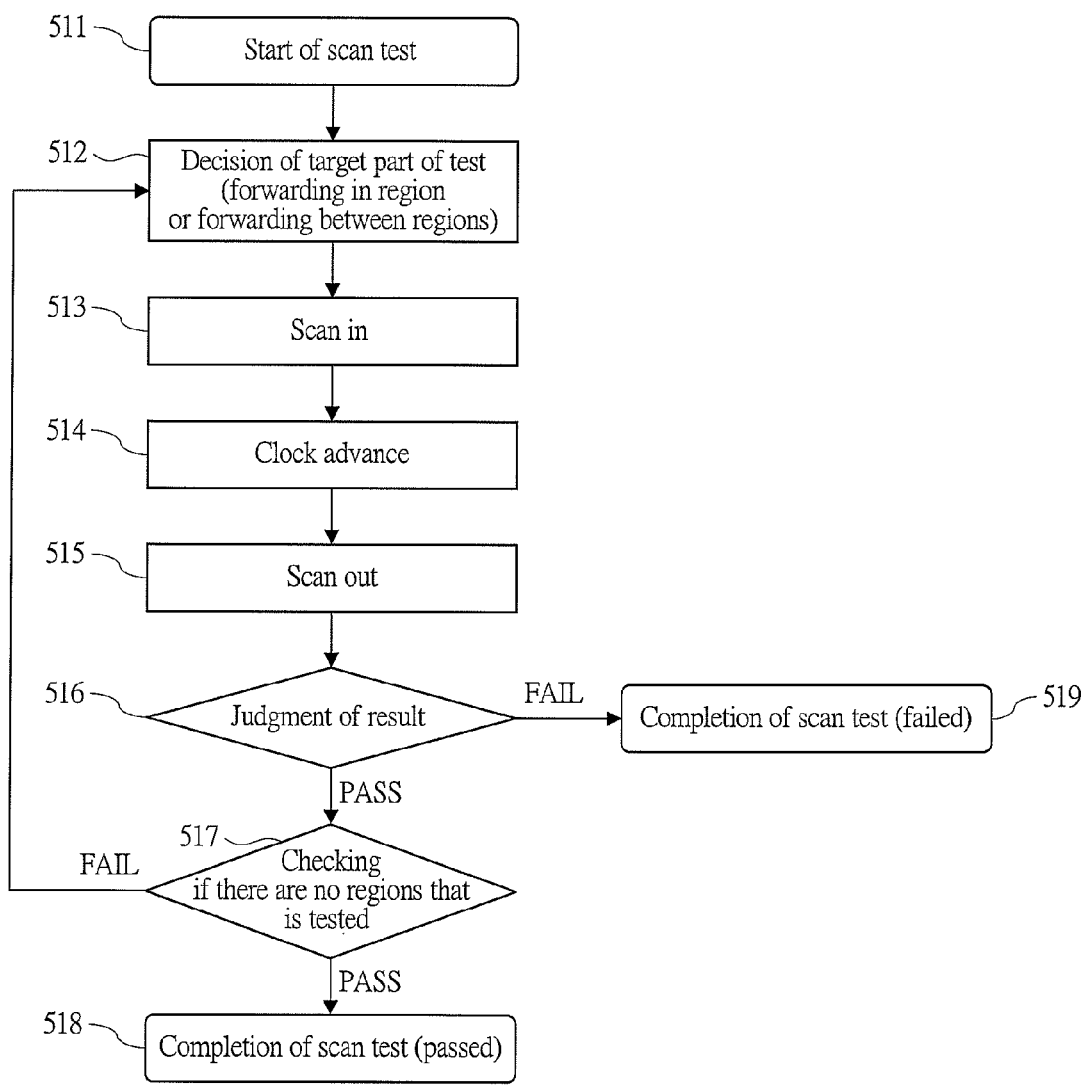
FIG. 5 is a drawing showing a test flow of a scan test operation.

FIG. 5 is a drawing showing a test flow in a scan test of the semiconductor integrated circuit device 100. After the scan test is started in a step 511, test regions to be test targets are selected in a step 512. In the selection of the test targets, a region to which test data is to be input and a region from which a result is to be retrieved are selected. The case in which the data input region and the result retrieving region are the same region is referred to as forwarding in region, and the case in which the input region and the retrieving region are different is referred to as forwarding between regions. When it is determined in a step 517 that any inspection target is remaining, the test targets are selected again from the uninspected target part. After the test target regions are selected, the scan-in of writing values to the scan flip-flops from the test pattern generator TPG, which outputs test data, through the scan chain is carried out in a step 513. As the operation of the test pattern generator TPG, it generates random numbers in the circuit by inputting initial random numbers from outside and outputs them as a test pattern to the scan chain. In a step 514, an actual test part (hereinafter, this phase is referred to as clock advance) of inputting the values, which have been written to the scan flip-flops, to a logic circuit of the LSI and retrieving the output of the logic circuit to the connected scan flip-flops is carried out. The scan-out of retrieving the values, which have been retrieved to the scan flip-flops by the clock advance phase of the step 514, to the multiple input signature register MISR, which is a result retrieving mechanism, through the scan chain is carried out in a step 515. As the operation of the multiple input signature register MISR, with respect to the result input from the scan chain, the information is compressed and retained therein. In a step 516, the result retrieved/compressed in the above described step 515 is judged, and when it is FAIL, the test is terminated as a fail judgment like a step 519. When the result is PASS in the step 516, it is determined whether there is any remaining inspection target or not in a step 517. When all the inspection targets have been inspected, the test is terminated as a pass judgment in a step 518, or when any inspection target is remaining, the process returns to the above described step 512, and the scan test is repeated again from the selection of the inspection targets until all the inspection targets are finished. As described above, in one cycle of the test, the regions to be the test targets are limited, and only the scan flip-flops in the target regions are operated. By this means, the amount of drop of the power supply voltage and power supply noise can be reduced. Hereinafter, the operations of the steps 513 to 515 which are the keys of the present embodiment will be described for each of the phases with reference to FIG. 6 and FIG. 7.

Figure 6:
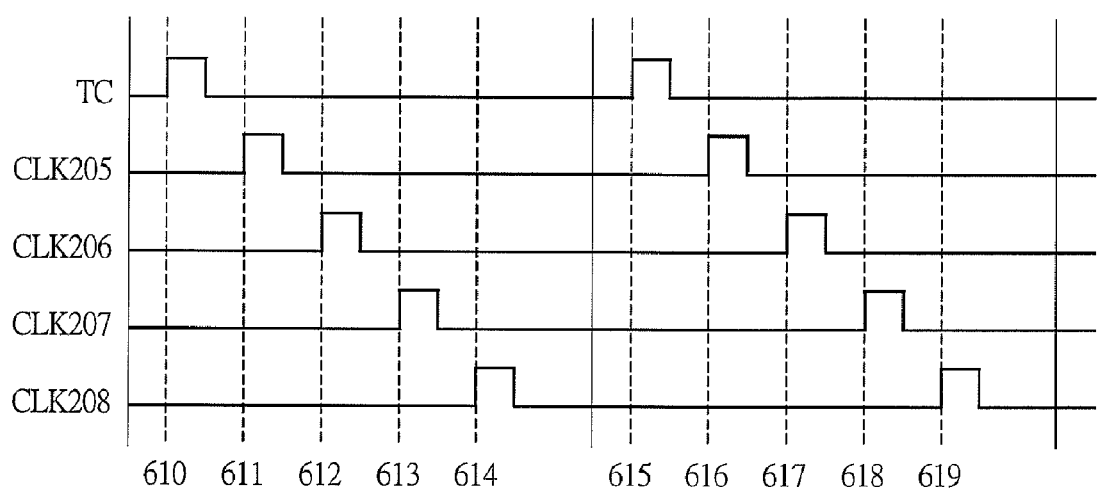
FIG. 6 is a time chart describing an operation in a scan-in phase according to the embodiment of the present invention.

FIG. 6 is a time chart at the start of the scan-in phase which is the step 513 and at the start of the scan-out phase which is the step 515 of FIG. 5 of the present embodiment. In the scan-in, the test clocks are input to the scan flip-flops of the circuit regions to be inspected 102 to 105 by the clock select signal. First, a TC clock which drives the test pattern generator TPG is input (610). Although the TC clock drives the test pattern generators TPG of the entire chip, the power supply noise generated by the operation of the test pattern generators TPG is extremely small and within the range that can be generated even by normal operations used by users. Therefore, clock division of the TC clock itself is not carried out. The test pattern generators TPG output the random numbers, which are generated in the circuits by using the initially-input random numbers, to the scan chains as test patterns. The values output from the test pattern generators TPG are imported into the scan flip-flops, which are connected by the scan chains, by clock inputs (611 to 614) of 205 to 208. Since the clocks of 205 to 208 are input at different timings as shown in FIG. 6, the power supply noise at the clock input is reduced compared with the case in which the entire chip is simultaneously operated. Thereafter, by the input of the TC clock and sequential input of the test clocks at different timings (615 to 619), the test data is passed to the entire scan flip-flops connected to the scan chains. The input timings of the clocks 205 to 208 supplied to the scan flip-flops may be mutually switched. The timing restriction between the test clocks is not required to be taken into consideration. Further, it is also possible to set the test data only for one distribution region by carrying out the clock input only for one system among the test clocks supplied to the distribution regions.

Also, in the scan-out which is the step 515 of FIG. 5, the TC clock, which is same as that for the test pattern generators TPG, is input (610) to the multiple input signature registers MISR. The multiple input signature registers MISR compress and retain the results output from the scan chains by the internal circuits thereof. Then, the values of the scan flip-flops on the scan chains are shifted by the clock inputs (611 to 614) of 205 to 208. Thereafter, the TC clock and the CLK 205 to 208 are subjected to clock input sequentially like 615 to 619, the result retrieval/compression by the multiple input signature registers MISR and the shifting operations of the scan chains are repeated, and when all the results on the scan chains are retrieved/compressed, the scan-out operation is completed. Also in the scan-out, the order and timing of inputting the input clocks to the scan flip-flops are not limited like the case of the above described scan-in. It is also possible to retrieve the test result of only one distribution region serving as the test target.

FIG. 7 is a time chart of the clock advance phase according to the present embodiment. In the clock advance phase, the normal clock or test clocks are selected and input to the circuit to be inspected for each test type by the clock selection mechanism.

Figure 7A:
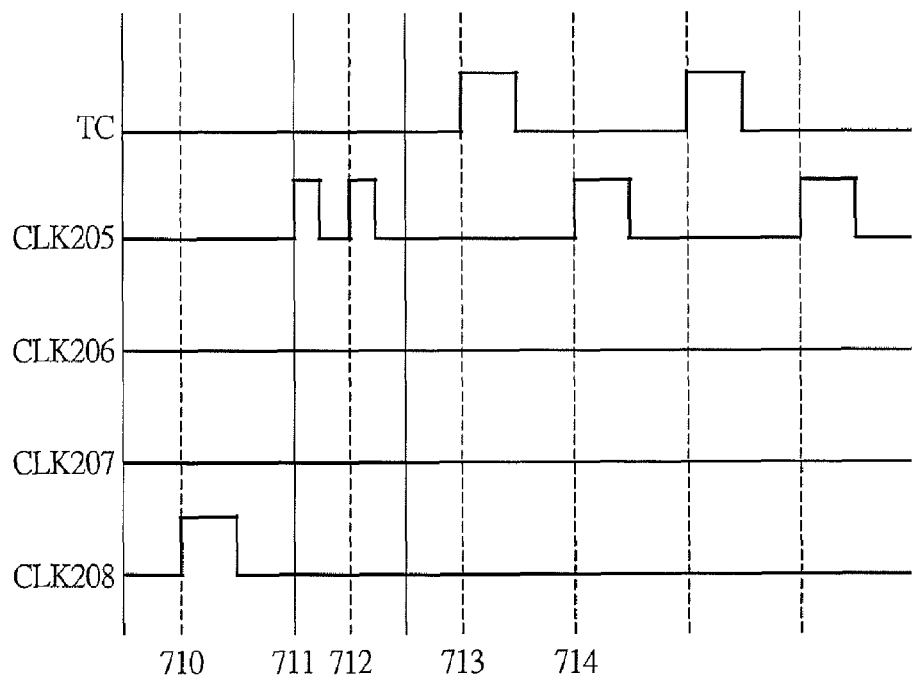
FIG. 7A is a time chart describing an operation of data forwarding in the same region in a clock advance phase according to the embodiment of the present invention.

FIG. 7A is a time chart of data forwarding in the same region (circuit region to be inspected 102) in the clock advance phase which is the step 514 of FIG. 5. First, after the last test clock of the scan-in phase is input (710), a release clock (711) and a capture clock (712) are input to the input clock CLK 205 to the circuit region to be inspected 102. The test data is output from the scan flip-flops to the logic circuit part by the release clock 711, and the test data which has passed through the logic circuit is acquired to the scan flip-flops by the capture clock 712, thereby completing one clock advance phase. Since both the release clock and the capture clock are input only to the circuit region to be inspected 102 by the CLK 205, the test target is limited to the forwarding from the scan flip-flop in the circuit region to be inspected 102 through the logic circuit to the scan flip-flop in the circuit region to be inspected 102. In the case of a dynamic test, since the interval between the release clock and the capture clock is shorter compared with the clock interval of the test clocks, the power supply voltage drop is affected. In the present invention, however, the power supply voltage drop can be reduced because the release clock and the capture clock are selectively input to one region (102) of the divided circuit regions to be inspected by the clock input on/off mechanism of the clock controller. After the clock advance phase is completed, the above described scan-out phase is carried out, and FIG. 7A shows the time chart in which only the values of the scan flip-flops of the circuit region to be inspected 102 serving as the test target are retrieved by carrying out clock input only for the input clock CLK 205 of the circuit region to be inspected 102 to which the capture clock has been input and for the TC which drives the multiple input signature register MISR as shown by 713, 714 . . . .

Figure 7B:
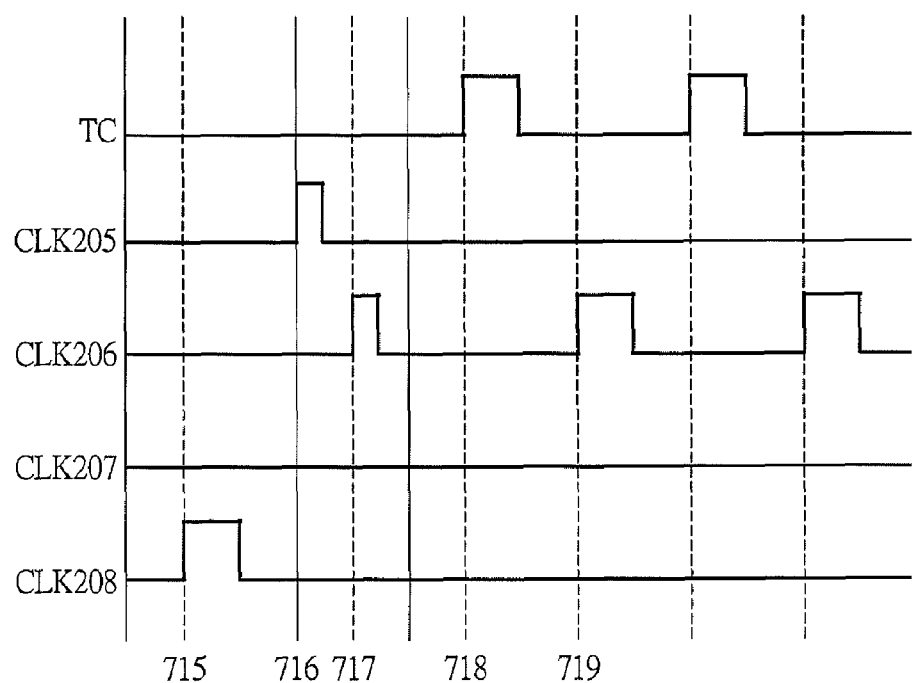
FIG. 7B is a time chart describing an operation of data forwarding between regions in a clock advance phase according to the embodiment of the present invention.

FIG. 7B is a time chart of data forwarding between regions (distribution region 102 and distribution region 103) in the clock advance phase which is the step 514 of FIG. 5. Similar to FIG. 7A, after the last test clock input (715) of the scan-in phase, a release clock (716) is input to the input clock CLK 205 to the circuit region to be inspected 102, and a capture clock (717) is input to the input clock CLK 206 to the distribution region 103. Since the release clock is input only to the circuit region to be inspected 102 and the capture clock is input only to the circuit region to be inspected 103, the test target is limited to the forwarding from the scan flip-flop in the circuit region to be inspected 102 through the logic circuit to the scan flip-flop in the circuit region to be inspected 103. Also in this case, since both the release clock and the capture clock are limited in one divided circuit region to be inspected, the drop of the power supply voltage can be reduced.

FIGS. 7A and 7B show timing charts of one type of the data forwarding in the same region and one type of the data forwarding between the regions in the clock advance phase which is the step 514 of FIG. 5, and since the input clocks are merely changed in other data forwarding in the same region and data forwarding between regions, details thereof are not described here. Further, when the operation of the clock advance is carried out, since the values of the scan flip-flops outside the test target region affect the result in the capturing, the values have to be fixed to unique values which can be reset or identified from outside. When the values (or expected values) of the scan flip-flops after the scan-in and the clock advance are terminated are assumed to be uniquely determined, clock advances having different test targets can be carried out by one time of scan-in/out although the execution order thereof is restricted, and the test time can be shortened by reducing the number of times of the scan-in/out.

Further, although the operations about the skewed-load method of the scan tests have been described in the present embodiment, the present invention can be applied also to the broad-side method which is another method of scan tests. Since basic operation principles themselves in the operations of the broad-side method are the same as those of the present embodiment, detailed descriptions thereof are omitted here.

Figure 8:
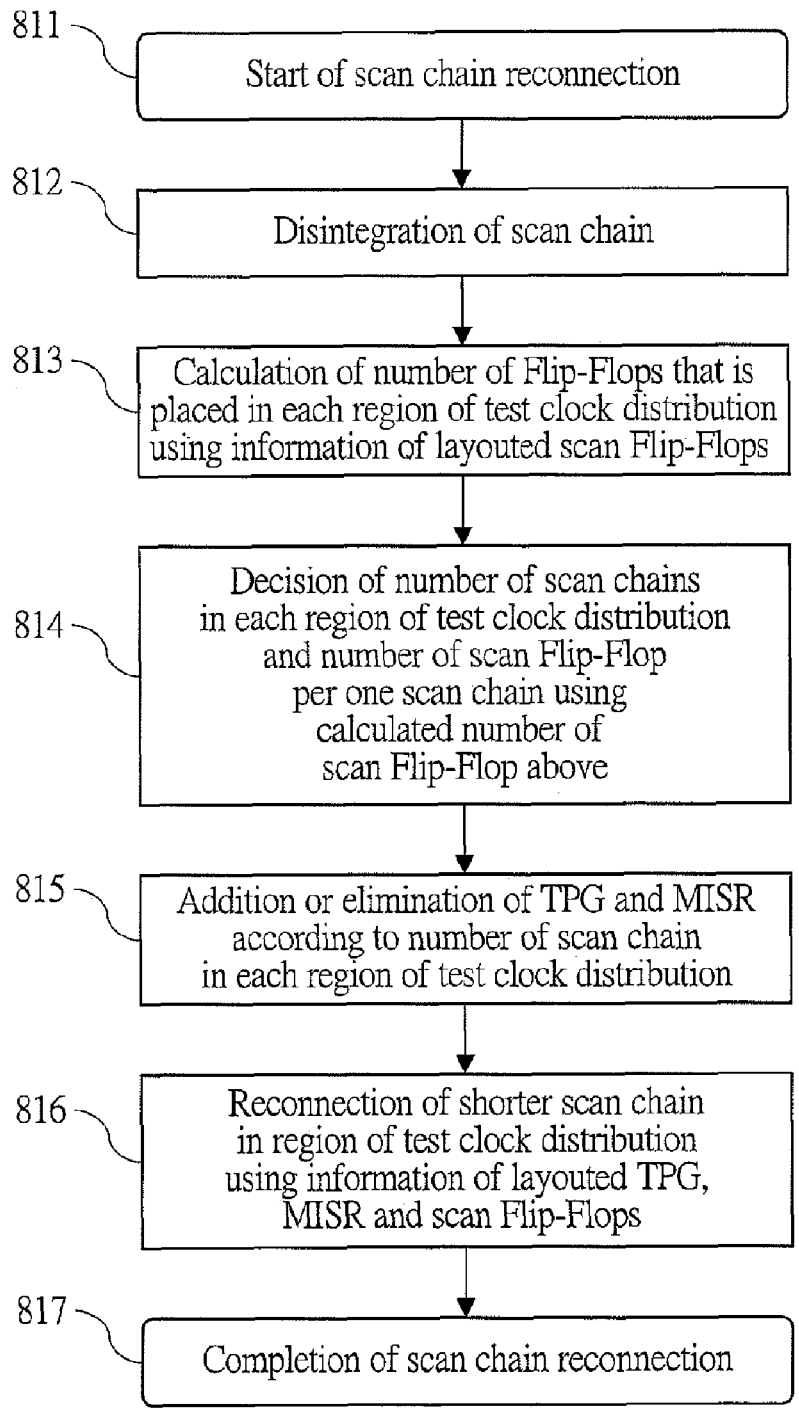
FIG. 8 is a drawing showing a flow chart carried out by a computer in a designing method according to the present invention.

FIG. 8 is a flow chart carried out by a computer in a designing method of the semiconductor integrated circuit 100. At the start of a reconnection process of scan chains in a step 811, an initial scan chain connection process is determined before physical layout, but the configuration thereof is determined by the number of scan flip-flops. Generally, the smaller the number of the scan flip-flops connected to one scan chain, the shorter the test time of the scan-in/out. However, when the number of the scan flip-flops connected per one chain is reduced, many test pattern generators TPG and multiple input signature registers MISR are required for the connection thereof, and as a result, the layout of normal logics is narrowed. The appropriate number of scan chains is determined in consideration of the above described trade-off, and initial scan chains are connected. When physical layout is actually carried out, connections of scan chains are not taken into consideration because scan flip-flops and normal logics are disposed so as to satisfy timing restrictions of actually used parts sandwiching the normal logics. Therefore, paths having long chain lengths and large data forwarding delays are generated. After the reconnection process of scan chains is started in the step 811, the initially formed scan chains are disintegrated in a step 812. Then, in a step 813, the number of the scan flip-flops disposed in each region of test clock distribution is calculated based on the physical layout information of the scan flip-flops. In a step 814, by using the calculated number of the scan flip-flops of each region of test clock distribution, the number of scan flip-flops to be connected to one scan chain is determined, and the number of scan chains of each distribution region is determined. The number of the scan flip-flops to be connected to the scan chains is determined so that excessive variations are not generated among the distribution regions while taking the test time and the area on which test circuits can be disposed into consideration like the case of determining the initial scan chains. In accordance with the number of scan chains determined in the step 814, in a step 815, the test pattern generators TPG and the multiple input signature registers MISR are added or eliminated. In the addition and elimination, the test pattern generators TPG and the multiple input signature registers MISR are added or eliminated in consideration of the mounting and wiring capabilities in the LSI. After the step 815, the scan chains are reconnected in a step 816. In the reconnection of the scan chains, the reconnection process of the scan chains is carried out so that the connection distance of the scan chains becomes short in each of the regions of test clock distribution by using the layout information of the TPG, MISR, and the scan flip-flops.

Figure 9:
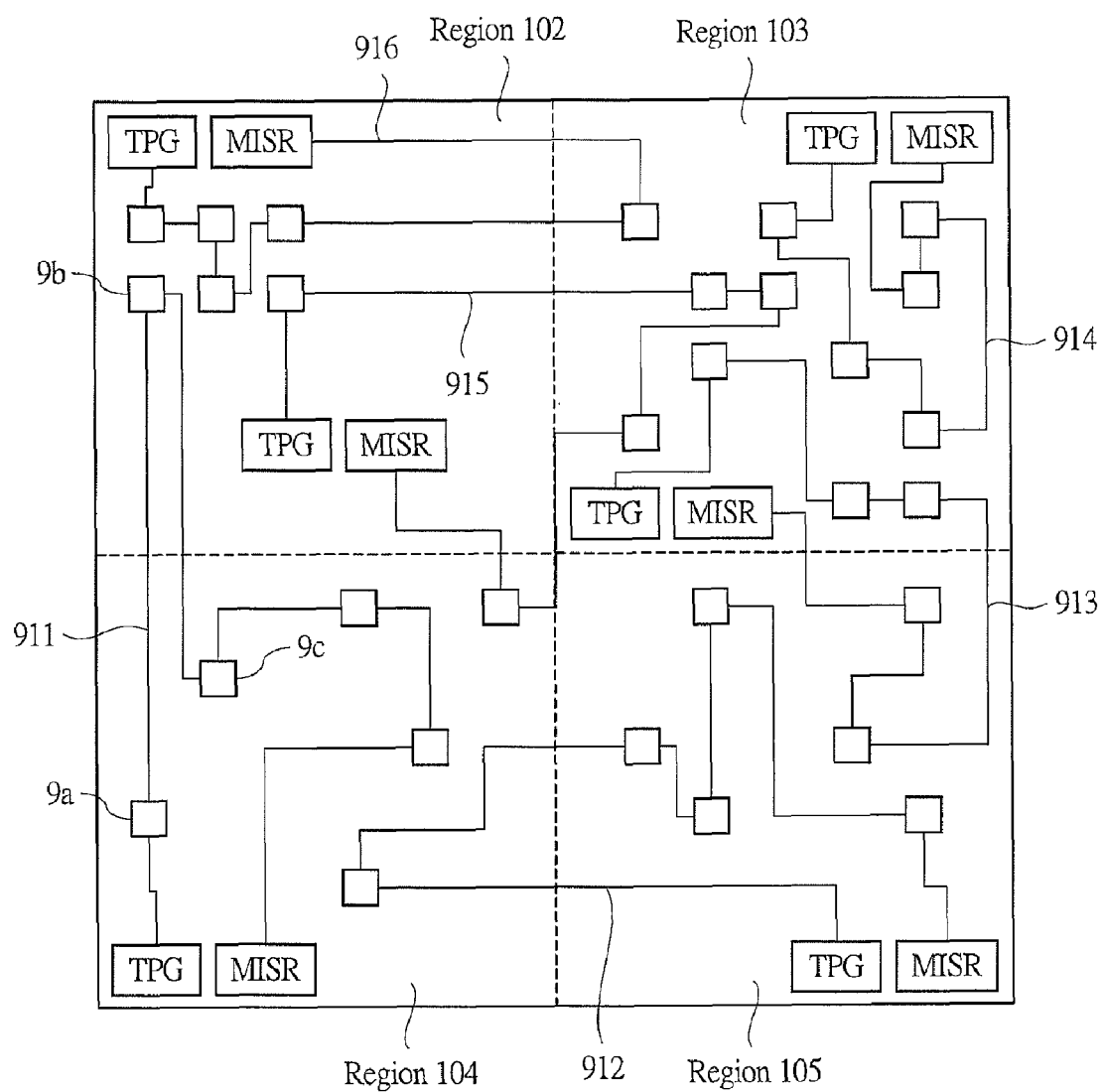
FIG. 9 is a drawing showing a general connection state of scan chains.
Figure 10:
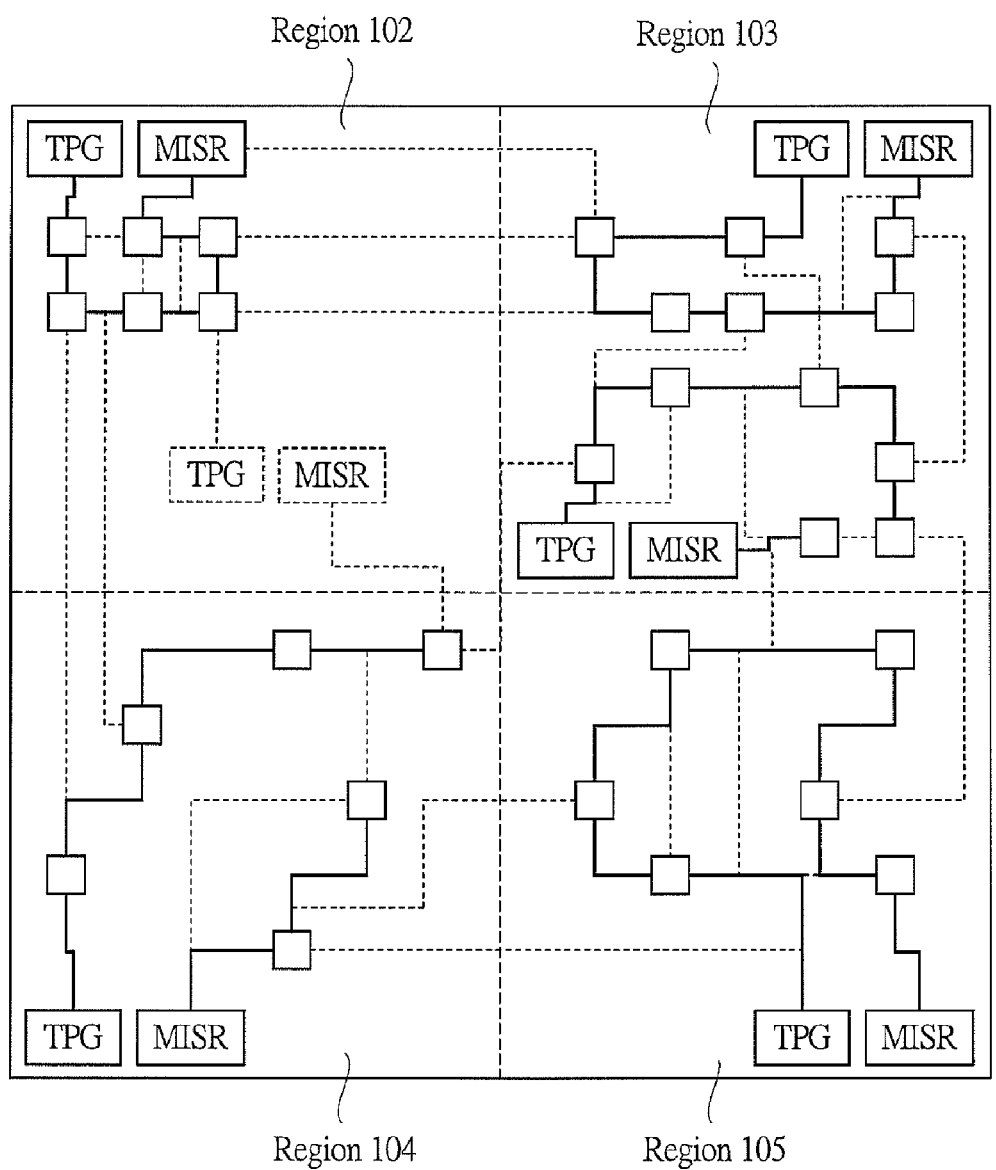
FIG. 10 is a drawing showing a connection method of scan chains in a specific example according to the embodiment of the present invention.

FIG. 10 shows an example in which the present invention is applied to the scan chain configuration of FIG. 9. As shown in FIG. 10, since the scan chains are reconnected in the distribution region of each supplied clock, the timing between the plurality of test clocks allocated to the same clock system is not required to be taken into consideration in the scan-in/out. Therefore, scan-in/out operations using independent test clocks having arbitrarily changed timing or scan-in/out operations by the input of a test clock only to a single distribution region can be ensured. Also, since consideration is made in the reconnection process of the scan chains so that the connection distances become short, data forwarding delays can be shortened, and the execution time per one test can be shortened.

What is claimed is:

1. A semiconductor integrated circuit device comprising:
a first flip-flop on a first scan chain path disposed in a first region;
a second flip-flop disposed on a second scan chain path disposed in a second region which does not overlap with the first region;
a first clock tree for distributing a clock to the first flip-flop;
a second clock tree for distributing a clock to the second flip-flop;
a gate circuit; and
a test clock generator for distributing generated test clocks to the first clock tree and the second clock tree via the gate circuit,
wherein the gate circuit independently shuts off inputs of the test clocks to the first clock tree and the second clock tree;
the semiconductor integrated circuit device further comprising:
a first test pattern generator;
a second test pattern generator;
a first multiple input signature register; and
a second multiple input signature register,
wherein the first test pattern generator generates first test data and inputs the first test data to the first flip-flop through the first scan chain path in scan-in,
the second test pattern generator generates second test data and inputs the second test data to the second flip-flop through the second scan chain path in the scan-in,
the first multiple input signature register reads data from the first flip-flop through the first scan chain path in scan-out, and
the second multiple input signature register reads data from the second flip-flop through the second scan chain path in the scan-out.

2. The semiconductor integrated circuit device according to claim 1,
wherein the gate circuit shuts off the input of the test clock to the first clock tree and the input of the test clock to the second clock tree at different timings.

3. The semiconductor integrated circuit device according to claim 1, further comprising:
a clock controller,
wherein the clock controller controls on and off of the gate circuit.

4. The semiconductor integrated circuit device according to claim 1, further comprising:
a selector; and
a phase lock loop for generating a normal clock and distributing the normal clock to the first clock tree and the second clock tree via the selector,
wherein the test clocks distribute the normal clock to the first clock tree and the second clock tree via the selector, and
the selector selects a clock to be output to the first clock tree and the second clock tree from the normal clock and the test clocks.

* * * * *